United States Patent [19]

Baril

[11] Patent Number: 4,956,614
[45] Date of Patent: Sep. 11, 1990

[54] DEVICE INCLUDING A RADIAL COMBINER FOR ELECTROMAGNETIC WAVES

[75] Inventor: Michel Baril, Lesigny, France

[73] Assignee: Thomson-CSF, Paris, France

[21] Appl. No.: 175,193

[22] Filed: Mar. 30, 1988

[30] Foreign Application Priority Data

Apr. 3, 1987 [FR] France ................................ 87 04726

[51] Int. Cl.$^5$ ............................................... H03F 3/60
[52] U.S. Cl. ..................................... 330/286; 333/125;
330/295; 332/144; 331/56
[58] Field of Search ............... 333/125, 127, 136, 137,
333/156; 330/286, 295; 331/56; 332/144

[56] References Cited

U.S. PATENT DOCUMENTS

| | | | |
|---|---|---|---|
| 3,963,993 | 6/1976 | Hoffman et al. | 330/286 X |
| 4,234,854 | 11/1980 | Schellenberg et al. | 333/137 X |
| 4,263,568 | 4/1981 | Nemit | 333/127 |
| 4,395,687 | 7/1983 | Belohoubek | 333/156 X |
| 4,398,161 | 8/1983 | Lamb et al. | 333/156 |
| 4,424,496 | 1/1984 | Nichols et al. | 330/286 |
| 4,477,781 | 10/1984 | Reuss | 330/286 |
| 4,549,152 | 10/1985 | Kumar | 333/156 X |
| 4,641,107 | 2/1987 | Kalokitis | 333/136 X |
| 4,812,782 | 3/1989 | Ajioka | 330/286 |

OTHER PUBLICATIONS

R.C.A. Review, vol. 42, No. 4, Dec. 1981, pp. 596–616, Princeton, N.J., US; M. Kumar: "Dual-Gate FET Phase Shifter"* p. 596, Lines 5–8; p. 597, lines 25–27, 38–39; p. 601, Lines 2–14; p. 612, line 5–p. 613, Line 8; FIGS. 1,2,17*.

IEEE Transactions on Microwave Theory and Techniques, vol. MTT-32, No. 3, Mar. 1984, pp. 317–324, IEEE, New York, US; J. Goel: "A K-Band GaAs FET Amplifier with 8.2-W Output Power", *pp. 320–321: Chapter V; FIGS. 1,7,10*.

M. I. Skolnik: "Radar Handbook", 1970, pp. 7-58/59, McGraw-Hill, Inc., New York, US, *pp. 7-58, Line 23–pp. 7-59, Line 12; FIG. 36*.

Primary Examiner—Eugene R. LaRoche
Assistant Examiner—Benny T. Lee
Attorney, Agent, or Firm—Oblon, Spivak, McClelland, Maier & Neustadt

[57] ABSTRACT

The invention provides a device including a radial combiner for electromagnetic waves and a method using a radial combiner. The invention provides a radial combiner with resistors disposed between the impedance matches capable of combining these signals from a plurality of radially disposed amplifiers or transmitters. By applying desired phase shifts to the signals transmitted by certain amplifiers or transmitters, amplitude-phase modulation of the total signal transmitted can be provided. It is more particularly possible to provide radar pulse modulation for reducing the frequency spectra of the transmitted signal.

10 Claims, 15 Drawing Sheets

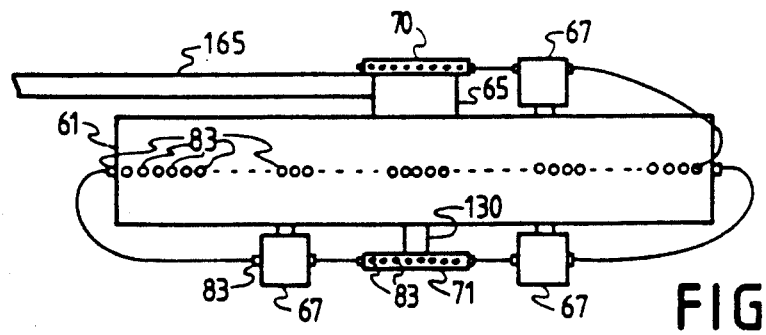
FIG. 10
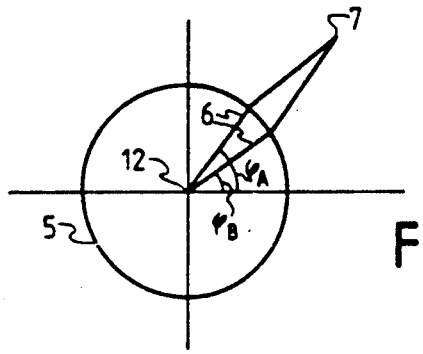
FIG. 11
FIG. 12
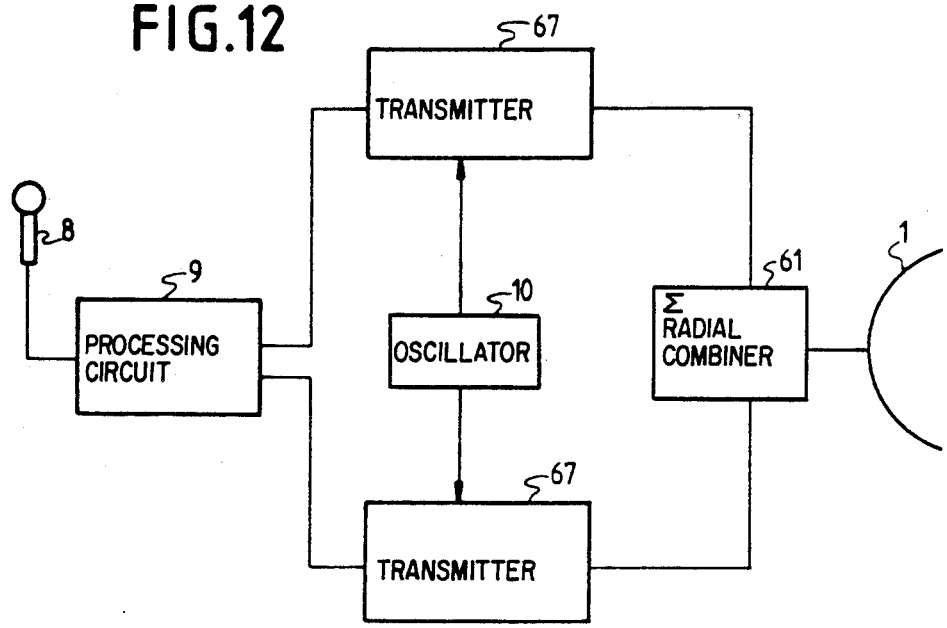

4,956,614

DEVICE INCLUDING A RADIAL COMBINER FOR ELECTROMAGNETIC WAVES

BACKGROUND OF THE INVENTION

The purpose of the invention is mainly to provide a device including a radial combiner for electromagnetic waves and a method using a radial combiner.

The use of the radial combiner of the present invention makes it possible to modulate the signal to be transmitted in amplitude and/or in phase by phase modulating the different amplifiers or transmitters connected in said combiner.

With the lowering of prices and improvement of the performances of semiconductor devices, they can replace tube devices even in the fields which up to now were reserved for tubes. This is particularly true in electromagnetic wave transmitters, particularly for radio broadcasting, television broadcasting or radar.

For these applications, a plurality of transistorized amplifiers or transmitters is often used coupled to a single antenna, each transmitter delivering a part of the total radiated power. The assembly of the plurality of transmitters poses problems of space as well as coupling the transmitters to the antenna.

One of the advantages of using a plurality of transmitters is to be able to continue operation despite a breakdown of some transmitters. The radial combiner used in the device of the present invention includes resistors for absorbing the energy likely to disturb the operation of the device in the case of a breakdown of certain transmitters.

The modulation of class B or C transistorized amplifiers is more difficult than that using tubes, for example of the Klystron type. This drawback is particularly important at low amplitude. In fact, the transistorized amplifiers or transmitters operating in class B or C only deliver an output power above a threshold. The transition about the threshold is abrupt generating a secondary frequency lobe spectrum of high amplitude. In addition, it is not possible to modify the shape of the pulses emitted using such transmitters by modulating the input signal.

In the device of the present invention, the phase variation caused by some transmitters connected to the input of a radial combiner makes it possible to obtain constructive or destructive interferences during the combination of the signal. Thus, depending on the value of the phase shifts applied, it is possible to obtain different amplitudes. It is thus possible in particular to modify the shape of the transmitted pulse, for example for minimizing the secondary frequency lobes generated by these pulses.

SUMMARY OF THE INVENTION

The invention provides principally an electromagnetic wave transmitting device comprising a radial combiner for electromagnetic waves having a plurality of inputs connected to a plurality of impedance matchers, an output connectable to a wave guide; amplifiers or transmitters are connectable to the inputs of the radial combiner, equipotential points during normal operation of the impedance matchers being connected together by resistors, wherein at least a part of the signals coming from said amplifiers or transmitters can be modified by a control circuit.

BRIEF DESCRIPTON OF THE DRAWINGS

The invention will be better understood from the following description and the accompanying Figs., given by way of non limitative examples in which:

FIG. 10 is a diagram illustrating the connection of a device of the present invention;

FIG. 11 is a diagram illustrating the principle of amplitude-phase modulation able to be used in the device of the present invention;

FIG. 12 is a diagram of a radiophonic transmission device using the device of the present invention;

In FIGS. 1 to 20, the same references have been used for designating the same elements.

DESCRIPTION OF THE PREFERRED EMBODIMENTS

Figure 1:
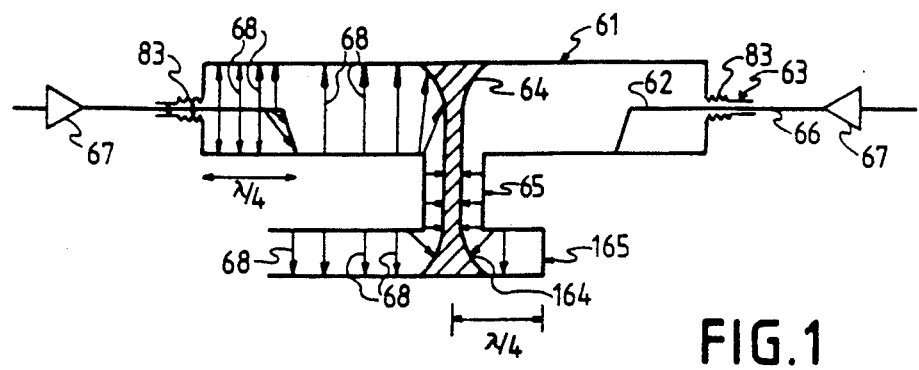
FIG. 1 is a sectional view of a radial combiner using the device of the present invention.
Figure 2:
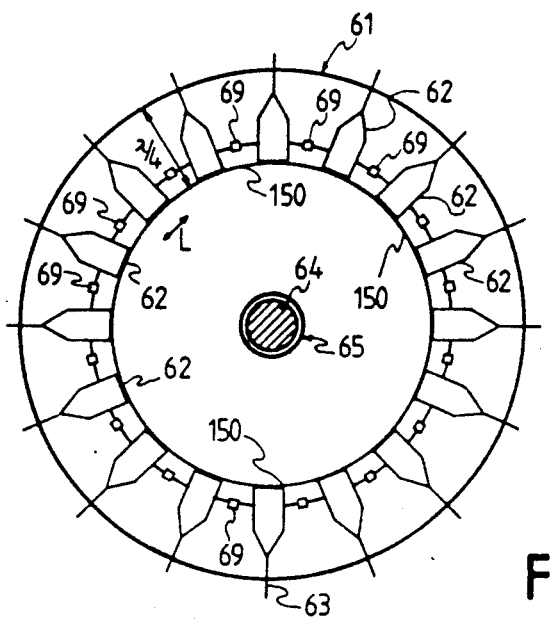
FIG. 2 is a sectional view of the radial combiner of FIG. 1.

In FIGS. 1 and 2 a radial combiner 61 is shown. The radial combiner 61 combines the electromagnetic energy coming from a plurality of amplifiers or transmitters 67 disposed radially so as to be able to feed a wave guide, not shown. The outputs of the amplifiers or transmitters 67 are connected to impedance transformers 62, for example by means of coaxial cables 63. The use of coaxial cables is made possible because each amplifier or transmitter 67 only generates a small part of the total energy, which is likely to be transmitted. Advantageously, the coaxial cables 63 are connected to the radial combiner 61 by means of connectors having a screw thread 83. The impedance transformers 62 comprise for example vanes connected to the center conductor 66 of the coaxial cable 63 and spaced evenly apart on the cylindrical periphery of the radial combiner 61. The outer conductor of the coaxial cable 63 is connected to ground which is formed by the structure of the radial combiner 61. The vanes have a length substantially equal to $\lambda/4$, $\lambda$ being the guided wavelength of the central frequency of the pass band for which the radial combiner is intended. The width L of each vane of the impedance transformer 62 is chosen so as to optimize the impedance matching between the coaxial cable 63 and the cavity of the radial combiner 61. The end of the vanes of the impedance transformers 62 is connected to ground. In the example illustrated in FIG. 1, the ends are connected to the inner frame of the radial combiner 61. The frame of the radial combiner 61 is extended, at its center, and downwards in the embodiment illustrated in FIG. 1, by a wave guide 65 whose center includes a metal piece 64 for coupling the cavity of the radial combiner 61 to the wave guide 65. Piece 64 is a metal piece having a symmetry of revolution and a widened form towards the upper wall of the radial combiner 61. The metal piece 64 is generally called "door knob" because of its ressemblance thereto.

The wave guide 65 is connected to a wave guide 165. At the level of wave guide 165, the metal piece 64 ends in a widened portion 164 similar to portion 64.

The arrows bearing the reference 68 in FIG. 1 symbolize the distribution of the electric field. The distribution of the electric field is symmetrical in the coaxial cable 63. Instead of impedance matchers 62, the field is distributed symmetrically above and below the vanes. Progressively, the field is distributed assymmetrically between the top and the bottom of the structure of the radial combiner 61.

The assembly of the impedance transformers 62 spaced apart evenly at the periphery of a circle generates a circular wave. At the level of wave guide 65 comprising a metal core, the field has a symmetrical structure. In the wave guide 165, the field has again an assymmetric structure having potential differences between the top wall and the bottom wall. The wave guide 165 is for example a wave guide with rectangular sections. The transmisson of energy is made possible by the presence of the metal pieces 64 and 164. The center of piece 164 is disposed at a distance equal to $\lambda/4$ from the beginning of the wave guide 165.

Advantageously, the ends of the vanes forming the impedance matchers 62 are connected together by a metal conductor 150 (see FIG. 2).

Should one of the amplifiers or transmitters 67 break down, the whole of the radiation emitted by the vanes of the impedance transformers 62 would no longer form a cylindrical wave. In this case, it is possible for higher order modes to be created disturbing the correct operation of a combiner 61.

Advantageously, resistors 69 (see FIG. 2) connect the vanes of the impedance transformer 62 together at points which during normal operation will be at the same potential on each vane.

Thus, during normal operation, with the two terminals of resistors 69 at the same potential, the resistors 69 dissipate no energy. Their presence is transparent for the operation of the device. On the other hand, should one or more amplifiers or transmitters 6 breakdown, a potential difference is created between the vanes of the impedance transformers 62. Resistors 69 in this case absorb the excess energy which otherwise would risk disturbing the correct operation of combiner 61.

Figure 3:
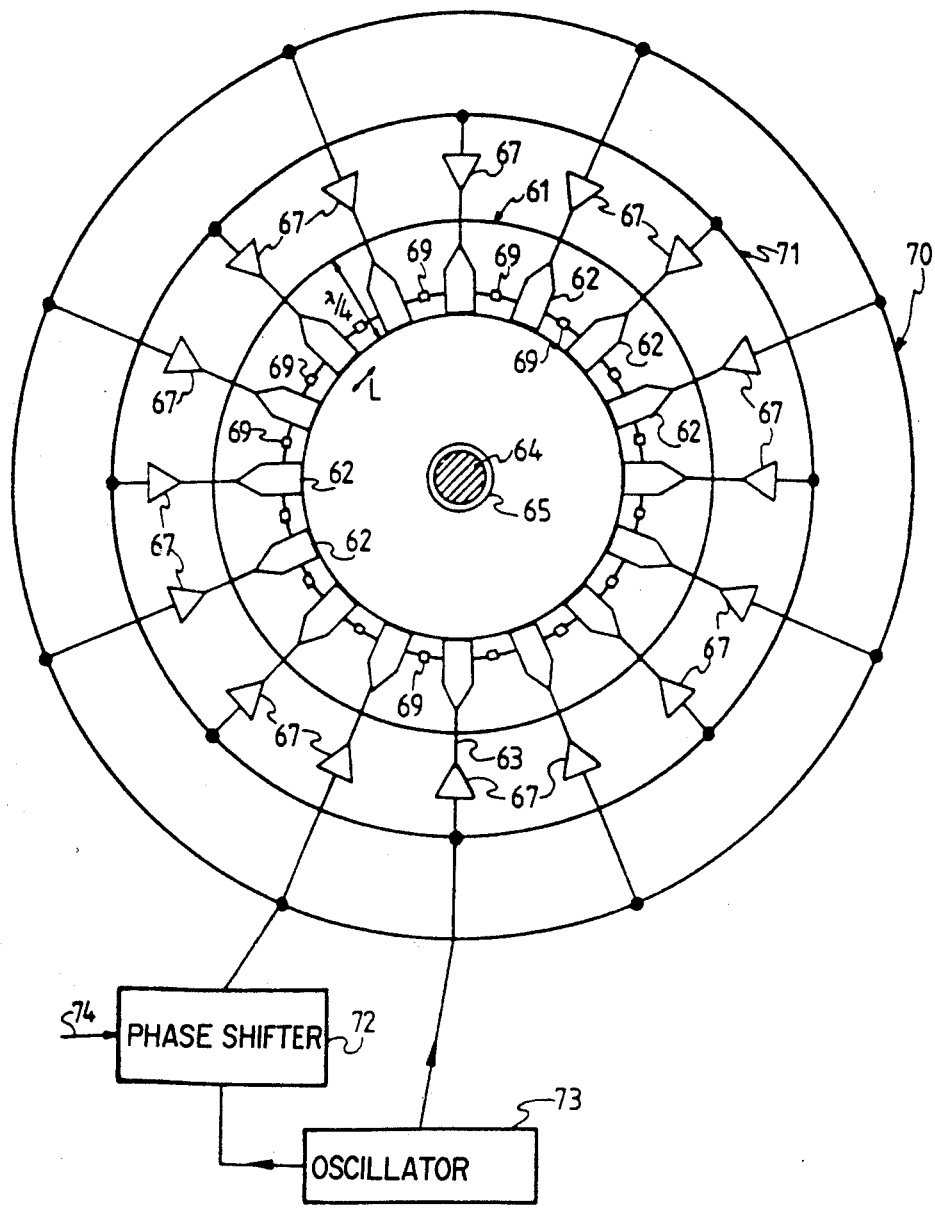
FIG. 3 is a diagram of a first embodiment of a transmission device of the present invention.

In FIG. 3, a transmitter device is shown including a radial combiner 61 to which two sets of amplifiers or transmitters 67 are connected.

The pilot oscillator 73 is connected directly to a first set of amplifiers or transmitters 67 by means of a connection device 71.

The pilot oscillator 73 is connected to a second set of amplifiers or transmitters 67 by means of a phase shifter 72 and a second connection device 70. The phase shifter 72 receives a control signal 74 for varying the phase delay for example between 0 and $\pi$.

Advantageously with the amplifiers or transmitters 67 disposed radially, one amplifier or transmitter 67 out of two is connected to a connection device 71, the other amplifiers or transmitters 67 being connected to the connection device 70.

When the phase shift introduced by the phase shifter 72 is zero, all the signals present at the input of all the amplifiers or transmitters 67 are in phase.

In such a case, the power available at the output of the radial combiner 61 is maximum. This energy is equal, if we neglect the losses, to the sum of the energies supplied by all the amplifiers or transmitters 67.

When the phase shifter 72 induces a phase shift of $\pi$, the amplitude of the signal present at the output of the radial combiner 61 is zero. The continuous or substantially continuous variation of the phase shift generated by phase shifter 72 makes it possible to pass from the zero value to the maximum vlue of the signal at the output of the radial combiner 61. Thus, it is possible to modulate the signal available at the output of the radial combiner 61.

Such modulation may be applied continuously not only to the signal but also to pulse modulation. Such modulation is possible even in the case of using transistorized amplifiers or transmitters 67, having a threshold despite which it does not deliver the output signal. In addition, the device of the present invention makes amplitude modulation possible using amplifiers working in class C, possibly under saturated conditions. By using class C amplifiers an excellent efficiency and other advantages proper to this amplifier are obtained.

Figure 4:
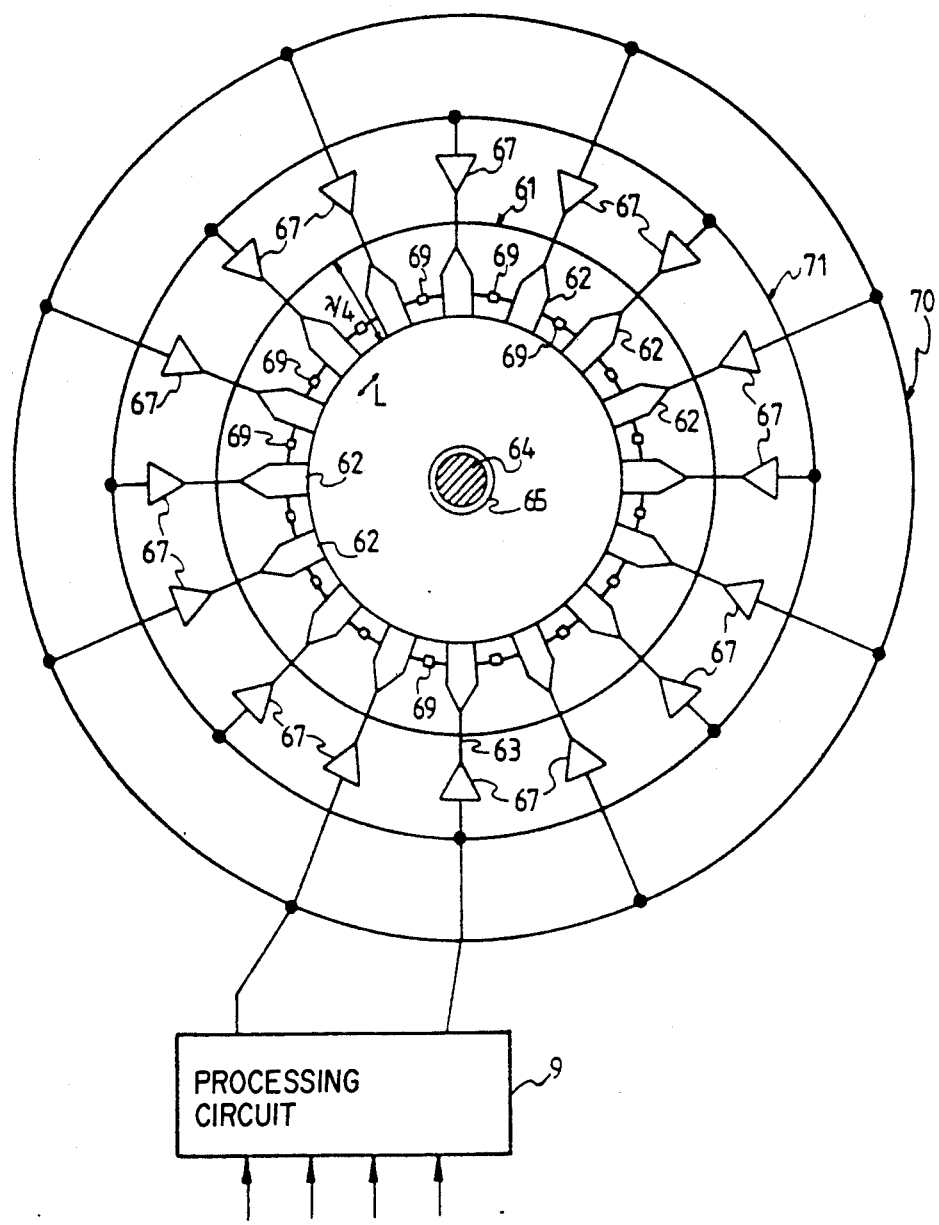
FIG. 4 is a diagram of a second embodiment of a transmission device of the present invention.

In FIG. 4 a device is shown using a radial combiner 61 for modulating the amplitude and the phase of the signal available at the output of the radial combiner 61. The device of FIG. 4 includes a processing circuit 9 whose operation will be illustrated in FIG. 14.

In the embodiment of the device of the present invention illustrated in FIG. 4, the processing circuit 9 has a plurality of inputs and two outputs connected to a connection device, respectively 70 and 71. The processing device 9 makes it possible to associate, with the values of the signals to be transmitted, the phases for obtaining the desired transmission signal.

Figure 5:
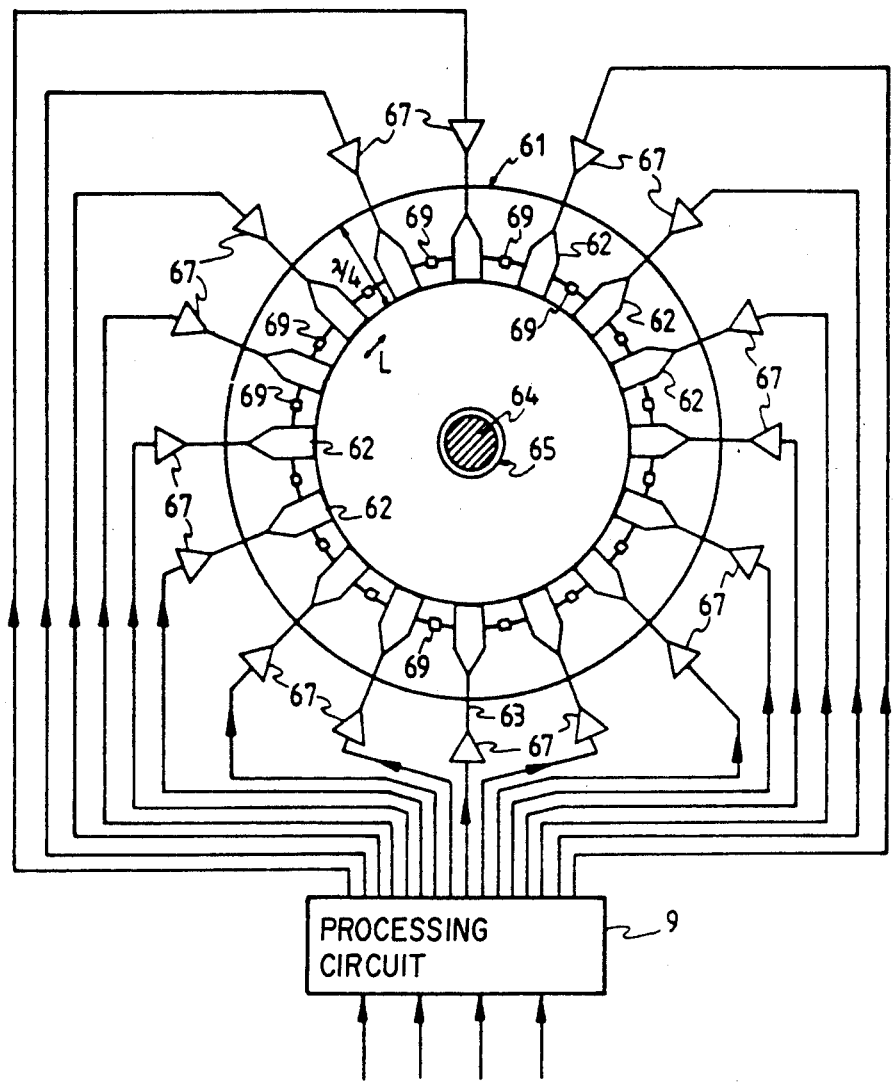
FIG. 5 is a diagram of a third embodiment of a transmission device of the present invention.

In the example illustrated in FIG. 5, the processing device 9 delivers to each amplifier or transmitter 67 the phase required for obtaining the desired modulation.

Figure 6:
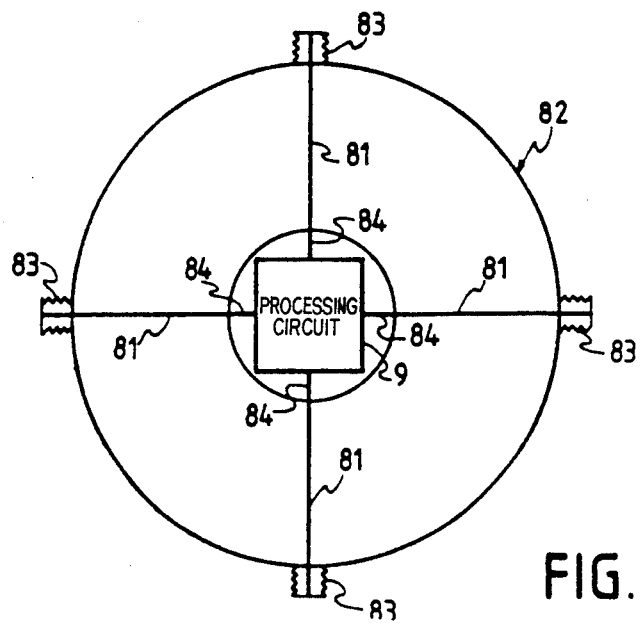
FIG. 6 is a diagram of an embodiment of the processing system of FIGS. 4 and 5.

In FIG. 6, a device 82 is shown for connecting the processing device 9. The processing device 9 is fixed to a circular connection device 82. The outputs of circuit 9 are connected to tracks, for example microstrips, disposed radially on device 82.

In a first embodiment of the device of the present invention, the outputs of the processing device 9 are connected directly to tracks 81. In a second variant of the device of the present invention, the outputs of the processing device 9 are connected by means of wires 84 to tracks 81.

Tracks 81 are joined for example to connectors 83.

In accordance with the microstrip technology, the second face of device 82 has a ground plane. However, this ground plane has passing therethrough the necessary connections to the inputs of the processing device 9. These inputs have not been shown in FIG. 6.

In a variant of construction of the device of FIG. 6, the inputs of the processing device 9 are also connected by means of tracks 81 of device 82. In FIG. 6, a processing device 9 has been shown having only four outputs. Of course, the construction of device 82 with a large number of outputs does not depart from the scope of the present invention.

Figure 7:
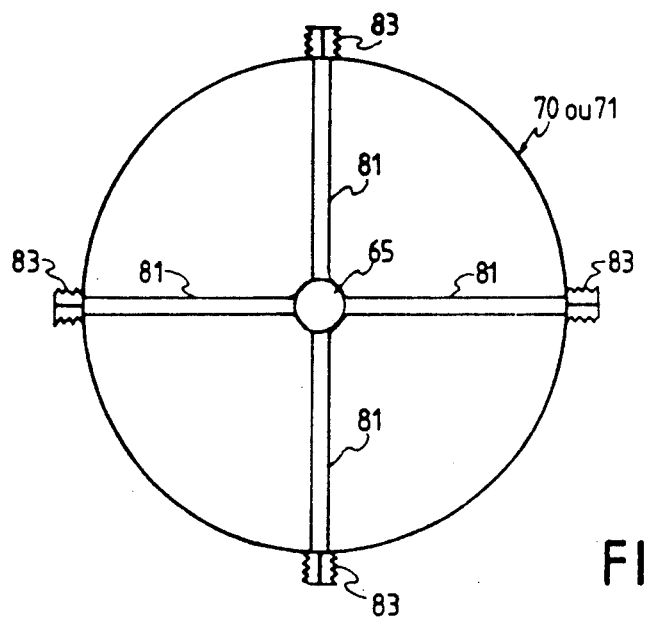
FIG. 7 is a diagram of a radial combiner usable in the device of the present invention.

In FIG. 7, a particularly advantageous embodiment of the connection device 70 or 71 may be seen. The connection device 70 or 71 includes tracks 81 made in accordance with the microstrip technology for providing the connection between an input waveguide 65 and, for example, connectors 83. The second face, in accordance with the microstrip technology, of the connection device 70 or 71 is metallized so as to form the ground plane. The input points 65 advantageously pass through this ground plane, while being isolated therefrom.

In FIG. 7, only four tracks 81 have been shown the use of a large number of tracks 81 does not depart from the scope of the present invention.

In a variant of construction of the connection device 70 and 71, two isolated planes are used for forming the tracks 81 of the connection device 70 and of the connection device 71. Advantageously, a ground plane is disposed between the planes of tracks 81 of the connection device 70 and that including the tracks 81 of the connection device 71. Advantageously, the input of this device, is formed by three coaxial conductors. The central conductor serves as conductor external to the coaxial cable formed by the first two conductors and as conductors internal to the coaxial cable formed by the last two conductors.

The connection device 70, 71 may of course be connected to the inputs of the amplifiers or transmitters 67 by means of lines, for example coaxial cables.

Figure 20:
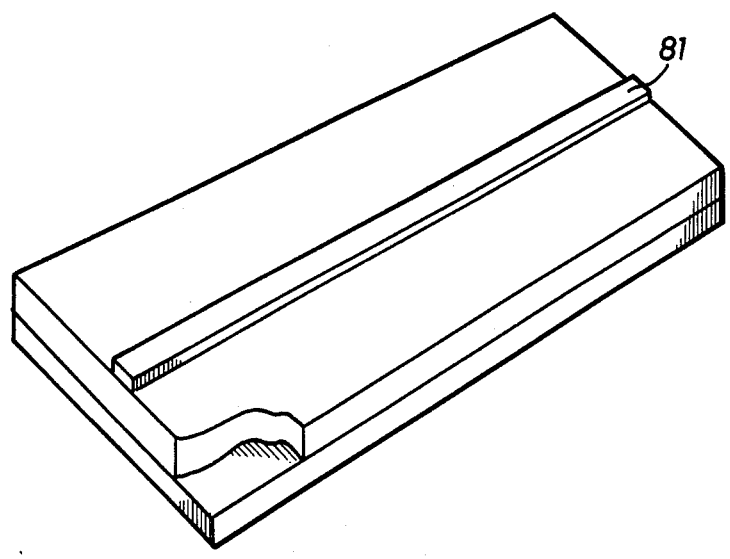
FIG. 20 shows a microstrip line used in FIGS. 6 and 7.

FIG. 20 shows a microstrip line 81 which may be used in the embodiments of FIGS. 6 and 7.

Figure 8:
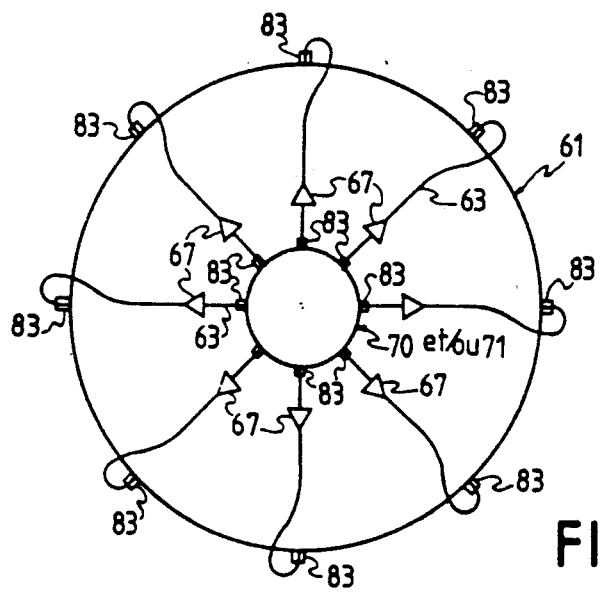
FIG. 8 is a diagram illustrating the connections of a device of the present invention.

In FIG. 8, one embodiment of the device of the present invention is shown having a connection device 70 and 71 disposed on a radial combiner 61. The outputs of the connection device 70 and/or 71 are connected for example by means of connectors 83 and coaxial cables 63 to amplifiers or transmitters 67. The amplifiers or transmitters 67 are connected to the inputs of the radial combiner 61 The inputs of the connection device 70 and/or 71 have not been shown in FIG. 8.

Figure 9:
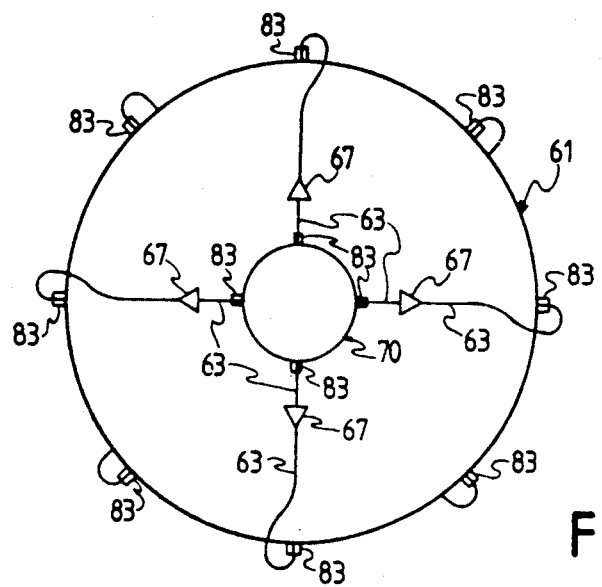
FIG. 9 is a diagram illustrating the connections of a device of the present invention.

In FIG. 9, an embodiment of the device of the present invention is shown having a connector 70 disposed on a face of a radial combiner 61; since the connection device 71 is disposed on the other face of said combiner, it is not visible in FIG. 9. The outputs of the connection device 70 are connected to the inputs of the amplifiers or transmitters 67, for example by means of connectors 83 and coaxial cables 63. The amplifiers or transmitters 67 are represented by their symbol in FIG. 9. The outputs of the amplifiers or transmitters 67 are connected, for example by means of connectors 83 and coaxial cables 63, to the inputs of the radial combiner 61. The same goes for the connection device 71 disposed on the other face of the radial combiner 61.

Advantageously, one input out of two of the radial combiner 61 is connected to the connection device 70, the other inputs being connected to the connection device 71; the inputs connected to the connection device 70 alternate with those connected to the connection device 71.

In FIG. 10, a profile view of the device of FIG. 9 can be seen in which there has been additionally shown the wave guide 165 for connection to a transmitting antenna not shown in FIG. 10. In FIG. 10, only three amplifiers or transmitters 67 have been shown in the form of electronic cards. Such cards will of course be held in position by a device of known type. The connection device 70 is disposed on the wave guide 65. The connection device 71 is disposed on a spacer 130 allowing a symmetrical arrangement ensuring the same phase delay due to the path travelled over by the signal. In FIGS. 10, only three amplifiers or transmitters 67 have been shown.

In FIG. 11, the principle of the amplitude-phase modulation has been shown which can be used in the device of the present invention. In FIG. 11, the signal 6 has been shown in polar coordinates which can be combined in the radial combiner 61. The module shows the amplitude of the transmitted signal, the angle the phase. The circle 5 shows the amplitude of transmitter 67 or of two sets of transmitters 67 used. A first signal 6 corresponds to a phase $\rho A$, the second signal 6 corresponds to a phase $\rho B$. The resultant signal 7 is obtained by vectorial addition of the signals 6 from the two transmitters.

Thus, it can be seen that the appropriate modulation of the phases $\rho A$ and $\rho B$ of the two transmitters 6 makes it possible to obtain an amplitude and phase modulated signal 7.

Advantageously, the method and device of the present invention are used for obtaining digital data transmissions.

In FIG. 12 one embodiment of a transmitter device has been shown using the amplitude-phase modulation.

The device comprises at least one source 8 of signals to be transmitted, for example a microphone. The source of the signals 8 is connected to a processing device 9. The processing device 9 converts the signals received into signals for controlling the transmitters 67 (or phase modulation devices not shown in FIG. 12) for obtaining the phases required for generating a signal which is a function of the signal to be transmitted. The processing device is connected to at least two transmitters 67.

Advantageously, a local oscillator 10 is connected to the two transmitters for increasing the frequency. It is possible to use several stages (not shown) for increasing the frequency. The signals from transmitters 2 are summated in a radial combiner 61. The output is then sent to broadcasting transmitter 1.

Figure 13:
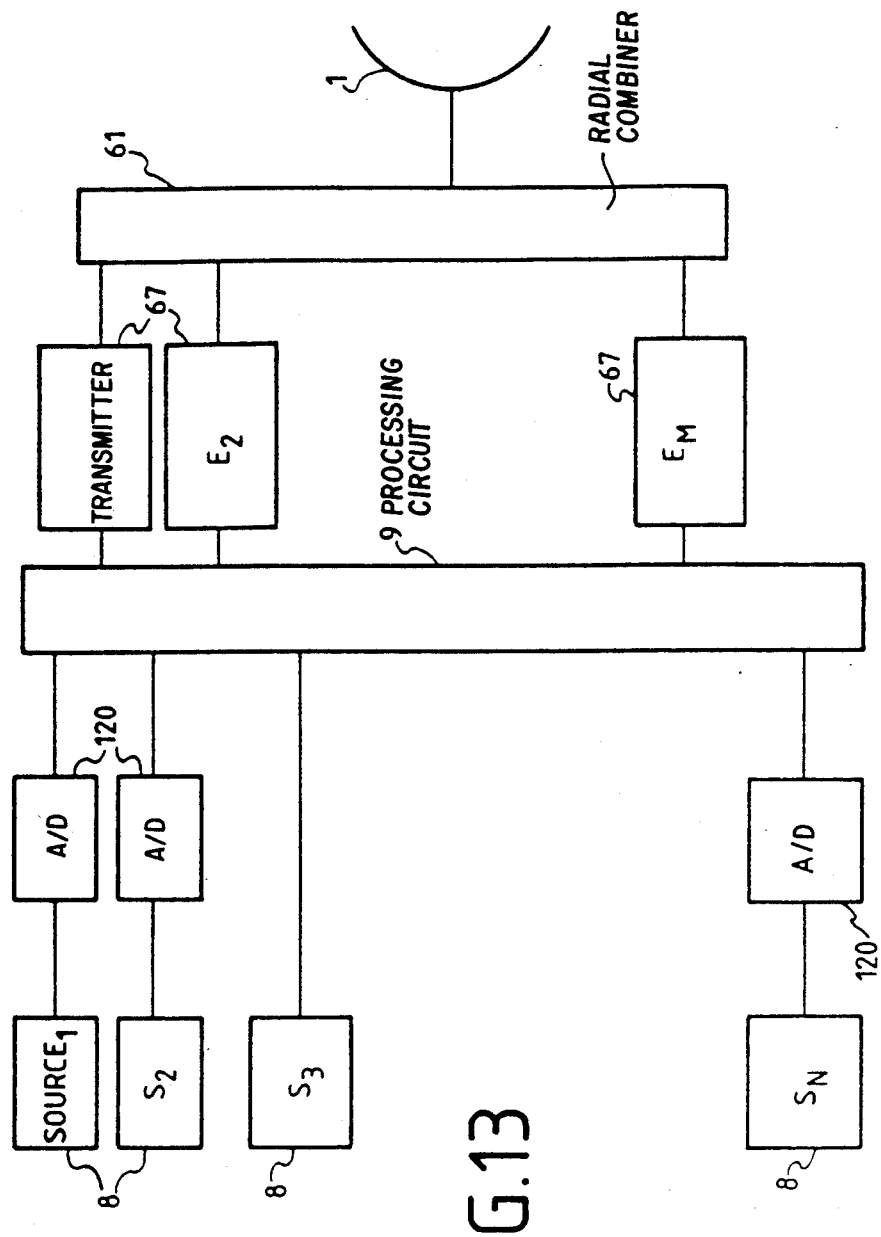
FIG. 13 is a diagram of a device of the present invention.

In FIG. 13, an embodiment of the transmitting device of the present invention has been shown with N signal sources 8. In the example illustrated in FIG. 13 an effective device effects digital transitions. Thus, in the case where analog signal sourcs are used, this signal must be digitized. Digitization of the signal is obtained either by the processing device 9, or as illustrated in FIG. 13 by means of A-D converters 120 placed upstream of the processing device 9. Of course, only the analog signal sources 8 are connected to A-D converters 120. The processing device 9 is connected to M transmitters 67. The M transmitters 67 are connected to a radial combiner 61. The radial combiner 61 is connected to an antenna 1. The processing device 9 delivers to the transmitter 67 the phase references necessary for obtaining the desired amplitude-phase modulation. The device illustrated in FIG. 13 makes it possible to provide simultaneous transmission over several paths by means of a single transmission channel or on the contrary, depending on the transmission conditions and the desired flow rates, the transmission of a single path over a plurality of transmission channels. For example, the information required for obtaining a television program is transmitted over a first frequency of the carrier and complementary information required for obtaining high definition images over a second frequency of the carrier.

Advantageously, the processing device 9 makes it possible to modify the signal to be transmitted, for example the processing device 9 modifes the chromatic balance of a color video signal or filters the high frequencies of a sound signal.

The use of digital transmission makes the information to be transmitted independent of the transmission channel, thus it is possible to use the device of the present invention more particularly for providing radio, television transmissions, transmissions over a short wave links for example or modulated radar pulse transmissions.

Figure 14:
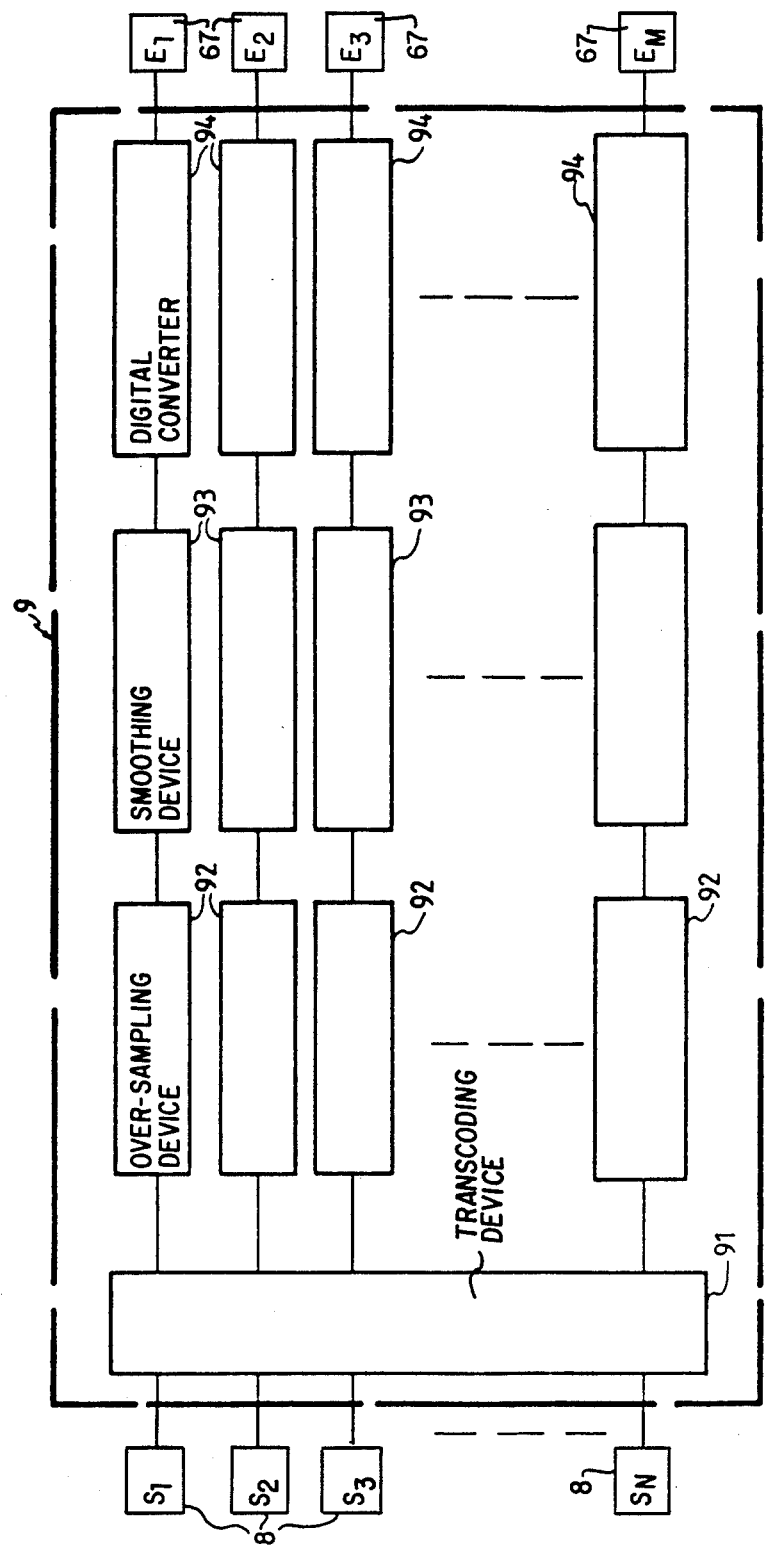
FIG. 14 is an embodiment of a processing circuit used in the device of the present invention.

In FIG. 14, a processing device 9 is shown for distributing N signal sources $S_1 \ldots S_N$ 8 over M transmitters 67 $E_1 \ldots E_M$.

Device 9 includes a transcoding device 91. The transcoding device 91 supplies the transmitters 2 with the signals required for transmission. For example: in the case of a single signal source 8 and two transmitters 67, a complex useful signal is transmitted $x(t) = \rho(t) \cdot e^{j\rho(t)}$ modulated in SSB (single side band) about a frequency $f_0$.

The transmitted signals e(t) are given by the formula:

$$e(t) = Real\ [x(t) \cdot e^{j2\pi f_0 t}]$$

$$e(t) = \rho(t) real\ [e^{j(2\pi f_0 t + \phi(t))}]$$

$$e(t) = \rho(t) cos\ (2\pi f_0 + \rho(t))$$

where x(t) is the value of the signal as a function time, $\rho(t)$ is the modulo of the signal (in polar form), and $\phi(t)$ is the phase of the signal.

Let us assume $\Delta \rho(t) = Arc\ cos\ \rho(t)/2$.

Thus the signal is obtained for modulating a first transmitter 67:

$$x_1(t) = e^{j\rho(t) + \Delta\rho(t)}$$

and the signal for modulating the second transmitter 67:

$$x_2(t) = e^{j\rho(t) - \Delta\rho(t)}$$

At the output of the radial combiner 67 we obtain a signal $$e'(t) = real[x_1(t) \cdot e^{j2\pi f_0 t}] + Real[x_2(t) \cdot e^{j2\pi f_0 t}]$$

$$e'(t) = real[[(x_1(t) + x_2(t)]e^{j2\pi f_0 t}]$$

$$e'(t) = real\left[\left[2\frac{e^{j\Delta\rho(t)} - e^{j\Delta\phi(t)}}{2}\right]e^{j\rho(t)}e^{j2\pi f_0 t}\right]$$

$$e'(t) = real[2\ cos\Delta\rho(t)e^{j2\pi f_0 t} + \rho(t)]$$

Thus the transmitted signal is equal to the signal which it was desired to transmit. In the case where the number M of transmitters 67 is greater than 2, the transcoding device 9 generates M signals $x_i(t)$, i varying from 1 to M, so as to obtain the signal to be transmitted by adding said signals. For a number M of transmitters greater than 2 there exists an infinity of elementary phase sets ($\rho 1 \ldots \rho M$).

The choice of coding may advantageously minimize the required pass band of transmitter 67.

The signals coming from N signal sources 8 are multiplexed in time and/or transmitted in parallel.

In a variant of construction of the device of the present invention, a known modulation law is used for each transmitter. For example, binary modulation laws are used. Advantageously, MSCK (Minimum Shift Keying) modulation is used for all the transmitters 2. In other embodiments, the CPFSK (continuous Phase Frequency Shift Keying) or FSK (Frequency Shift Keying) modulation laws are used.

Advantageously, the transcoding device 91 is connected in parallel to M over-sampling devices 92. The over-sampling device 92 over-samples the signal for example in the ratio of 4 or 6 or 8.

Figure 19:
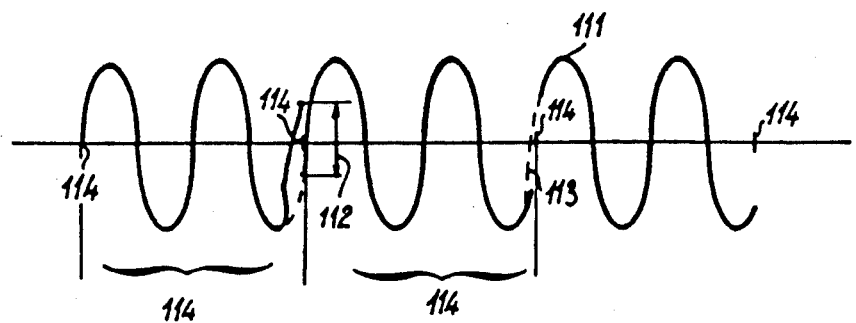
FIG. 19 illustrates the smoothing of the signal carried out by the processing circuit of FIG. 14.

Advantageously, the oversampling device 92 is connected to a device for smoothing the signal 93. The device for smoothing the signal between two transmitted data reduces the signal jumps and thus reduces the pass band required for transmission. Smoothing of the signal in device 93 has the drawback of reducing by a factor 2 the time intervals during which the transmitted information is stable, this results in a loss of about 3 dB at the reception level. The smoothing results are shown in FIG. 19.

Advantageously, the smoothing device is connected to a device for placing the signal in digital form on the carrier. The outputs of the device 94 for placing the signal in digital form on the carrier are connected to transmitter 67 (not shown in FIG. 14).

Figure 15:
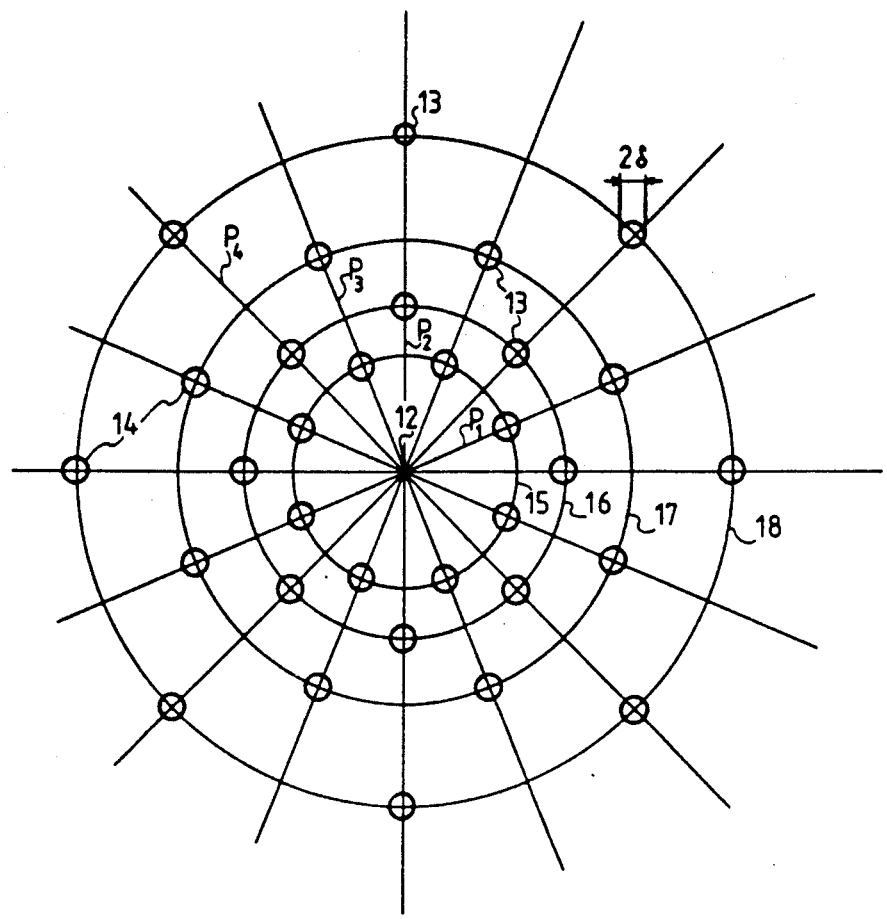
FIG. 15 is a diagram illustrating a first example of digital transmission.

In FIG. 15, an example is shown of distributing the digital values of the signal in the complex plane having an origin 12 obtained with two transmitters or sets of transmitters 67. The signal has 32 different values, which corresponds to a digital transmission over 5 bits. The digital value corresponding to disks 13 of a diameter equal to $2\delta$ distributed over four circles 15, 16, 17 and 18 of a respective diameter $\rho 1$, $\rho 2$, $\rho 3$ and $\rho 4$. $\rho 1$ is for example equal to the $\sqrt{2}/2$, $\rho 2 = 1$, $\rho 3 = \sqrt{2}$ and $\rho 4 = 2$, the power of a transmitter being standardized at 1. The points 14 are distributed evenly over each circle.

The digital values are shown by disks 13 of a diameter $2\delta$ corresponding to an uncertainty about the corresponding points 14 of the theoretical signal transmitted by combining the signals transmitted by transmitters 2 of FIG. 7. In fact, it is of prime importance to be able to determine the digital value on reception, namely the point 14 of the complex plane (amplitude, phase) which has been transmitted despite the deformation of the information. The deformation of the information is due more particularly to distortions and thermal noise. The size of disks 14 depends on the probability of error which can be accepted.

For example, to a radius $\delta$ of disks 14 equal to: 4.75 $\sigma$ ($\sigma$ being the typical deviation of the thermal noise) there corresponds a probability of error of $10^{-6}$;

$7\sigma$ there corresponds a probability of error of $10^{-12}$;

and $10\sigma$ there corresponds a probability of error of $10^{-23}$

A probability of error of $10^{-6}$ may be considered as too high for transmissions for it corresponds to errors always present on the screen. These defects may completely deform the high definition television image using image compression for transmission.

The choice of δ influences the number of different states (or points 13) which can be transmitted.

The invention is not limited to disks 14. It is possible to use other surfaces 14 in a complex plane for determining the digital value of a point, such for example a polygons.

In a variant of construction of the device of the present invention, disks 14 are not used for jointing. To the space between disks 14 there is attributed no digital value. On reception, a signal not belonging to a disk 14 is not processed.

In a second variant of construction of the device of the present invention, jointing regions 14 are used.

Advantageously, points 13 are the barycenters of regions 14.

Advantageously, in order to reduce the risk of error at reception, disks 13 are spaced apart as much as possible. Thus, on each circle through points 14, points 14 of the preceding circle are placed on the bisectors. In the example illustrated in FIG. 15, the phase discrimination is equal to $\pi/8$, the signal/noise ratio is between 15 and 24 dB.

Figure 16:
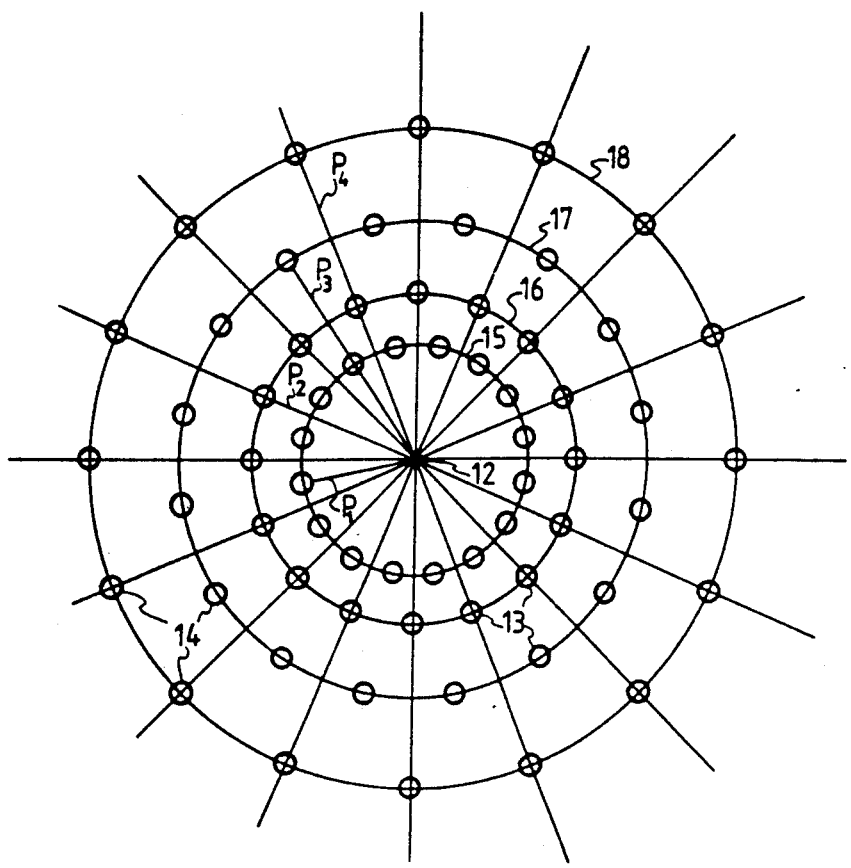
FIG. 16 is a diagram illustrating a second example of digital transmission.

In FIG. 16, an example is shown of distributing in the complex plane digital values transmitted over 6 bits, namely comprising 64 distinct points 14. Points 14 are distributed over 4 circles referenced from 15 to 18 of a respective diameter $\rho 1 = \sqrt{2}/2$, $\rho 2 = 1$, $\rho 3 = \sqrt{2}$, $\rho 4 = 2$, the power of a transmitter 2 being standardized at 1. The required phase accuracy is equal to $\pi/16$.

Figure 17:
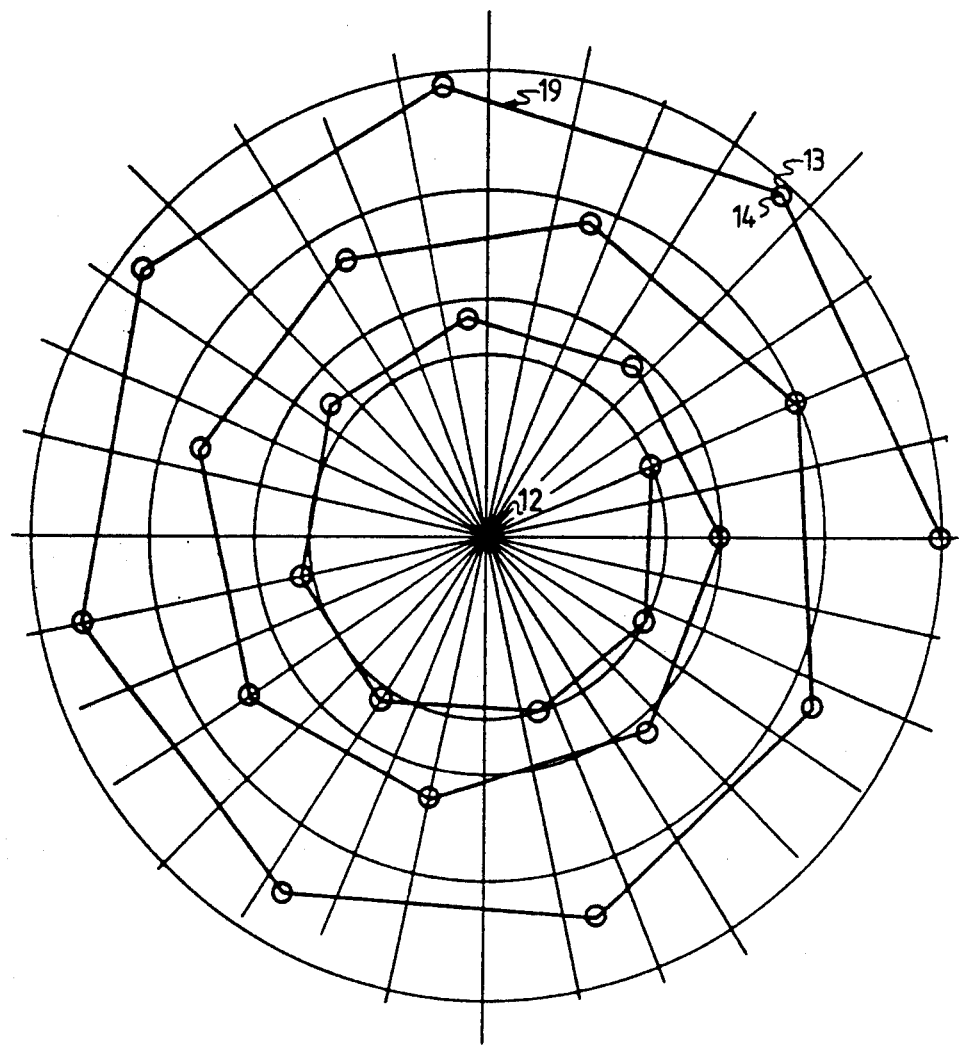
FIG. 17 is a diagram illustrating a third example of digital transmission.

In FIG. 17, is shown a distribution in the complex plane of the different digital values to be transmitted minimizing the risks of confusion. Points 14 are distributed over a spiral with center 12 between two circles corresponding to the minimum power required for the desired signal/noise ratio and a circle corresponding to the power sum of all the transmitters used. Advantageously, the spiral is a logarithmic spiral.

In FIG. 17, twenty-four distinct points 14 have been shown corresponding to a signal/noise ratio of 30 dB. The spiral used was approximated by a curve 19 formed by connecting points 14 together.

In FIG. 18, the different pulse forms 132 have been shown which can be transmitted, for example, by radar devices or the aerial control device.

Figure 18A:
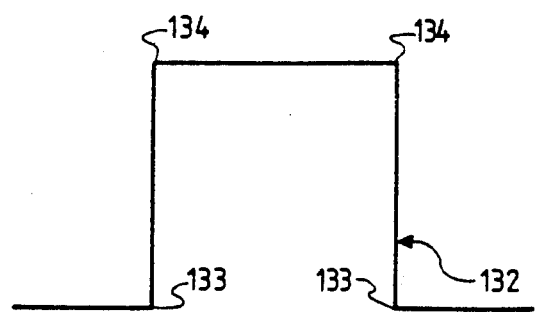
FIGS. 18a–18d illustrates a possibilty of pulse modulation using a device of the present invention.

In FIG. 18a, a rectangular pulse 132 has been shown. Rectangular pulses are the easiest to generate. However, they have the drawback of having a very wide frequency spectrum, and so require a wide pass band of the transmitter and they generate undesirable secondary frequency lobes. In fact, the secondary frequency lobes disturb the correct operation of the device working on adjacent frequencies.

Widening of the spectrum is caused by the presence of sudden transitions particularly at the level of the base of pulse 133 not only the rising front but also on the falling front of the pulse as well as at moment 134 when the transmitted energy is maximum.

Figure 18B:
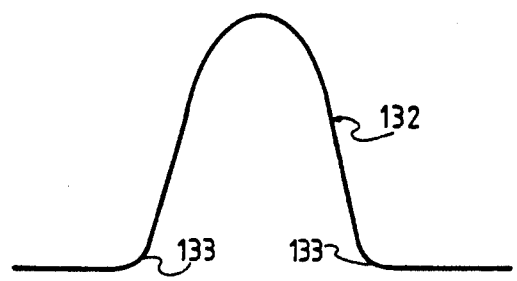

In FIG. 18b, a substantially gaussian pulse 132 has been shown which has very small secondary frequency lobes. Pulse 132 illustrated in FIG. 18b has smooth transitions not only at the level of the base 133 of the pulse but also at the top of the amplitude of the pulse. Such a substantially gaussian pulse can be generated by the device of the present invention.

Figure 18C:
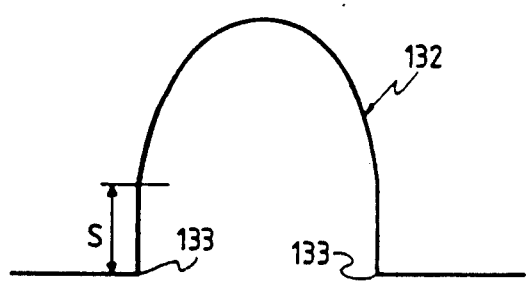

In FIG. 18c, a pulse has been shown which is obtained by modulation applied to the input of the amplifiers or transmitters 67 having a triggering threshold S, such for example as the transistorized amplifier or certain tube amplifiers. When the input signal of an amplifier or transmitter 67 is increased without reaching the value S of the threshold, no signal is transmitted. As soon as the value of the threshold is reached, a signal corresponding to a non zero amplitude is transmitted. The sudden passage is characterized at the level of the shape of the pulse by a rectangular base having right angles at 133.

In the FIGS. 18a–18c, the amplitude has been shown which is obtained at the output of an amplifier or transmitter 67 in response to the threshold S.

Although it is possible to modulate the tops of the pulse 132, the rectangular form of the base of the pulse generates considerable secondary frequency lobes at the frequency level. The use of the radial combiner of the present invention makes it possible to approximate the shape of pulse 132 in FIG. 18b, the residual energy being absorbed by resistors 69.

Figure 18D:
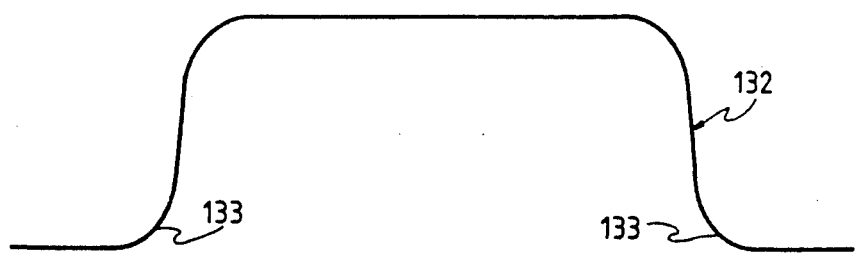

In FIG. 18d, a long pulse 132 has been shown with rounded shapes for limiting the frequency spectrum. This spectrum limitation is obtained in the case of long pulses with only a very small power loss. However, it may cause a loss in the distance resolution for a radar device not having a pulse compression device.

As we have seen, the resistors 69 of FIGS. 1 and 2 are intended to absorb the power, going up to 3 dB, coming from the pulse modulation. Of course, in the device intended to be able to operate in this manner continuously, it is essential for the resistors 69 to be able to dissipate this power.

In the variants of construction of the device of the present invention, in which it is desired to obtain a periodic modulation of the signal and not only modulation of the pulses, it is possible to recover the excess energy existing at the level of the impedance transformer 62 for reinjecting it after a delay for bringing it into phase with the signal to be transmitted.

In FIG. 19, the principle has been shown of the smoothing carried out by device 93 of the processing device 9. In FIG. 19, the same reference 114 has been used for designating time intervals or periods as well as for designating instances defining these time intervals.

To simplify the Fig., the example illustrated in FIG. 19 is phase modulation (and not amplitude-phase modulation). Of course, this principle also applies to amplitude-phase modulation.

Smoothing of the signal reduces the pass band of the transmitters and the self distortion of the signal during the digital transmission.

In digital transmission with phase modulation the digital value to be transmitted depends on the phase of the signal inside a period 114. Thus at point 111, the signal presents a phase jump 112. The presence of this phase jump risks disturbing the correct operation of the device, particularly by self distortion in the case where the pass band of the channel is sufficient. Thus, advantageously, the processing device 9 of FIG. 14 includes a smoothing device replacing the phase jump 112 by a phase transition 113. The smoothing is obtained, for example, by interpolation between the values at the level of points 114. The phase being of course modified about points 114. Thus it is important not to make any phase measurement at those times. In the case where the phase measurement is provided by means of a matched filter providing integration of the signal during the period 114, it will be necessary to modify the integration time of the filter so as to integrate only the part of the period 14 during which the phase transmitted is correct.

Of course, the modulation of the amplitude of the pulses of the invention may be associated with other pulse modulations such for example as frequency or phase modulation. Phase modulation makes it possible for example to obtain pulse compression. Similarly, the present invention applies to radars with frequency agility, the pulses transmitted at different frequencies being modulated in amplitude so as to minimize the secondary frequency lobes.

The invention applies more particularly to pulse modulation, and to amplitude and/or phase modulation of radioelectric signals.

The invention applies mainly to pulse modulation for radars and aerial control devices as well as to the transmission of data with amplitude-phase modulation usable more particularly for radiophonic transmissions or high definition television transmissions.

What is claimed is:

1. An electromagnetic wave transmitting device comprising:
   a radial combiner;
   a plurality of inputs connected to said radial combiner;
   a plurality of impedance matchers, with each impedance matcher being connected between the radial combiner and a corresponding one of said plurality of inputs;
   said radial combiner having an output connected to a waveguide;
   a plurality of transmitting means each connected to a corresponding one of said plurality of inputs;
   a plurality of resistors connecting impedance matchers which are at the same potential during normal operation;
   said plurality of inputs arranged into at least two groups with at least one input in each group, a first group comprising certain ones of said plurality of inputs and receiving a first input signal from corresponding transmitting means connected thereto and a second group comprising certain other ones of said plurality of inputs and receiving a second input signal different from said first input signal from corresponding transmitting means connected thereto;
   a control circuit connected to the transmitting means of at least one of said groups to modify the corresponding input signal;
   wherein nonidentical signals of each group are combined to produce an output.

2. The device as claimed in claim 1, wherein said control circuit is a phase shifter.

3. The device as claimed in claim 1, wherein said control circuit is a circuit for processing the corresponding input signal.

4. The device as claimed in claim 3, wherein each transmitting means receives an individual control signal from the processing circuit.

5. The device as claimed in claim 3 comprising a device for connecting the processing circuit to coaxial cables connected to the inputs of the transmitting means, the connection of the processing circuit being formed using microstrip technology.

6. The device as claimed in claim 3, wherein the processing circuit codes the corresponding input signals.

7. The device as claimed in claim 3 wherein the processing circuit modulates the corresponding input signals.

8. The device as claimed in claim 1, wherein said device is a radar.

9. The device as claimed in claim 1, wherein said transmitting means is a transmitter.

10. The device as claimed in claim 1, wherein said transmitting means is an amplifier.

* * * * *